United States Patent [19]

Regan et al.

[11] 4,266,292

[45] May 5, 1981

[54] METHOD AND APPARATUS FOR TESTING ANALOG-TO-DIGITAL AND DIGITAL-TO-ANALOG CODE CONVERTERS

[75] Inventors: John F. Regan, Lombard; Satyan G. Pitroda, Villa Park, both of Ill.; Byung C. Min, Belmont, Calif.

[73] Assignee: Wescom Switching, Inc., Oak Brook, Ill.

[21] Appl. No.: 950,844

[22] Filed: Nov. 20, 1978

[51] Int. Cl.³ .............................................. H04J 3/14
[52] U.S. Cl. ........................................ 370/13; 371/25
[58] Field of Search ...................... 179/15 BF; 370/13; 340/146.1 E; 371/21, 25

[56] References Cited

U.S. PATENT DOCUMENTS

| | | | |
|---|---|---|---|
| 3,057,972 | 10/1962 | Mann | 179/15 BF |
| 3,154,738 | 10/1964 | Greene | 179/15 BF |
| 3,499,994 | 3/1970 | Lord | 179/175.2 R |
| 3,683,115 | 8/1972 | Schellenberg | 179/15 BF |
| 3,787,628 | 1/1974 | Van Dijk | 179/15 BF |
| 3,892,923 | 7/1975 | Ranner | 179/15 BF |
| 4,156,110 | 5/1979 | Keeney | 179/15 BF |

Primary Examiner—David L. Stewart
Attorney, Agent, or Firm—Leydig, Voit, Osann, Mayer & Holt, Ltd.

[57] ABSTRACT

An apparatus and method for testing for faults in an analog-to-digital (A/D) section and a digital-to-analog (D/A) section of a code converter in a digital time division, multiplex telecommunications system are disclosed. The A/D section is tested by connecting a digital test pattern via the switching network to the D/A section and monitoring for faults by comparing the resulting output to a reference value. The A/D section is tested by interconnecting the A/D section to be tested between a first previously tested D/A section and a second previously tested D/A section and then connecting the digital test pattern to the first D/A section while monitoring the output of the second D/A section for faults.

34 Claims, 9 Drawing Figures

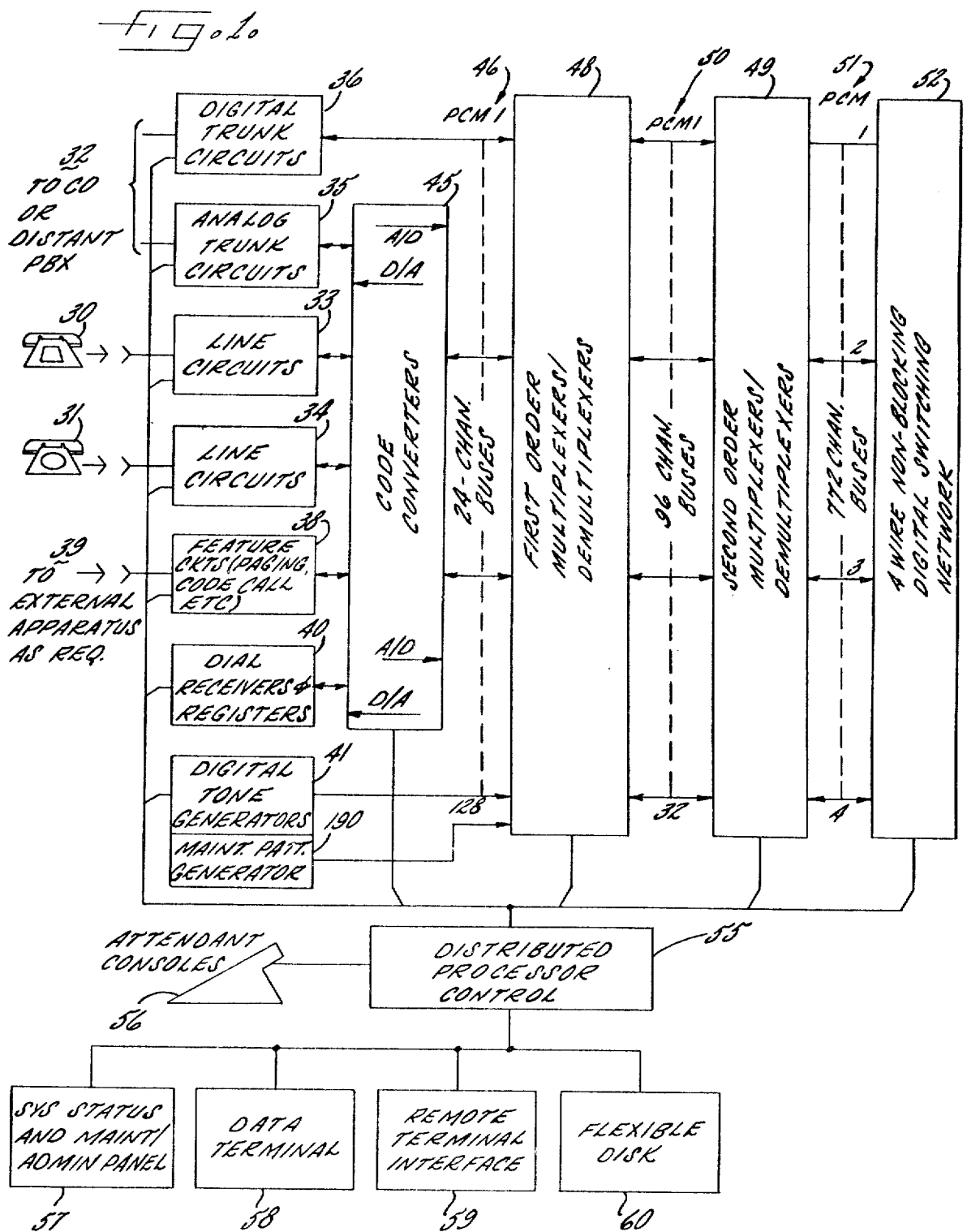

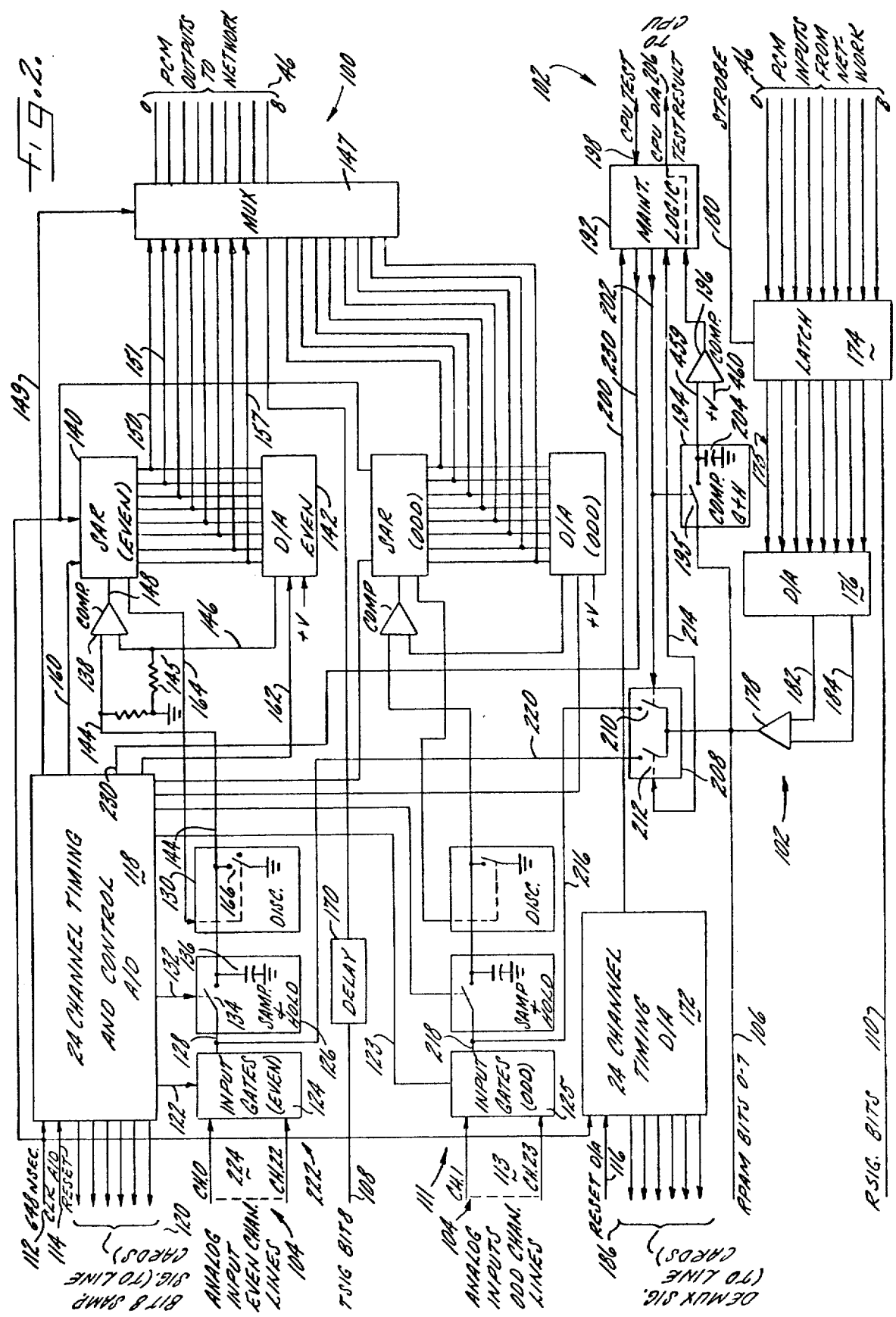

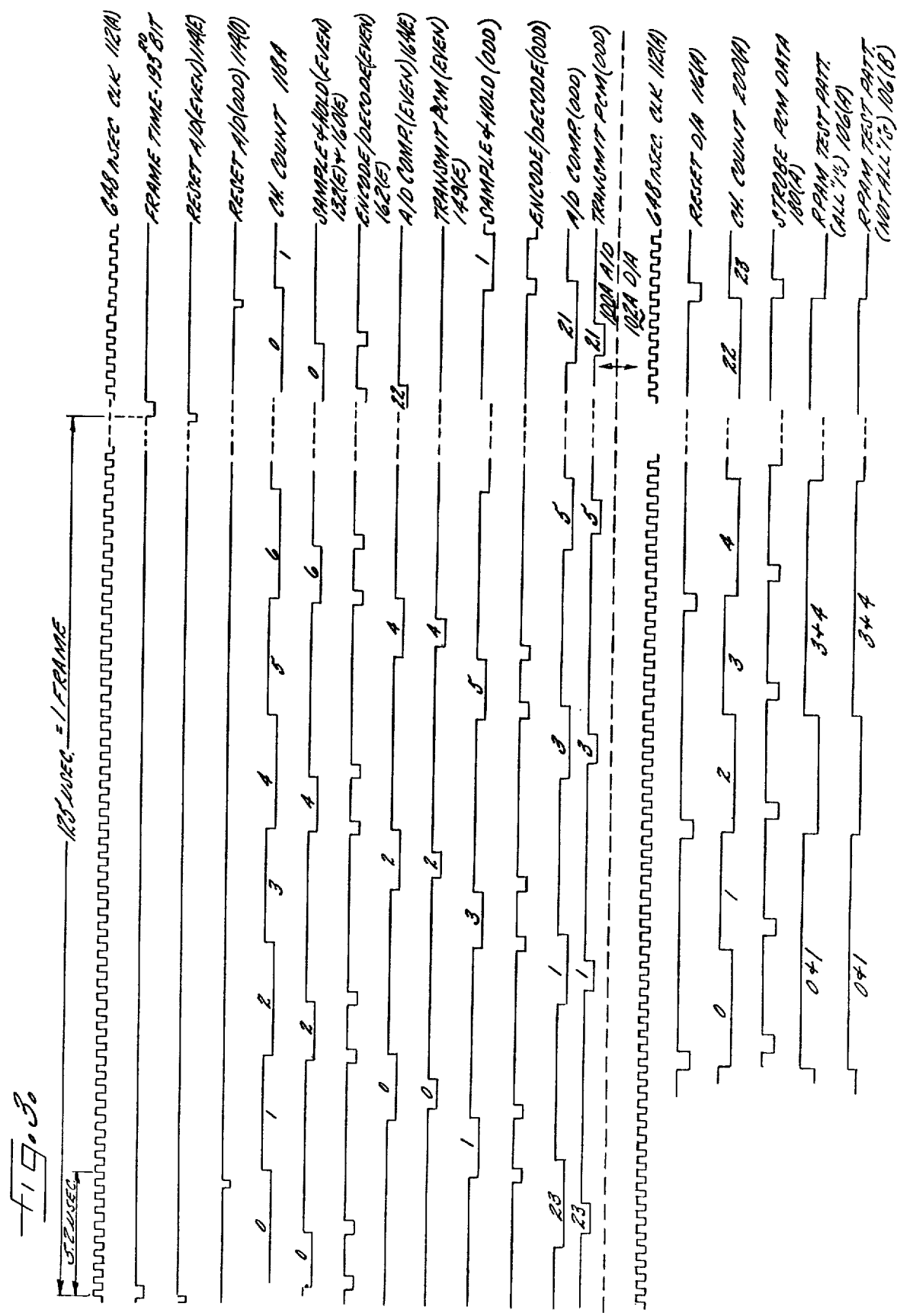

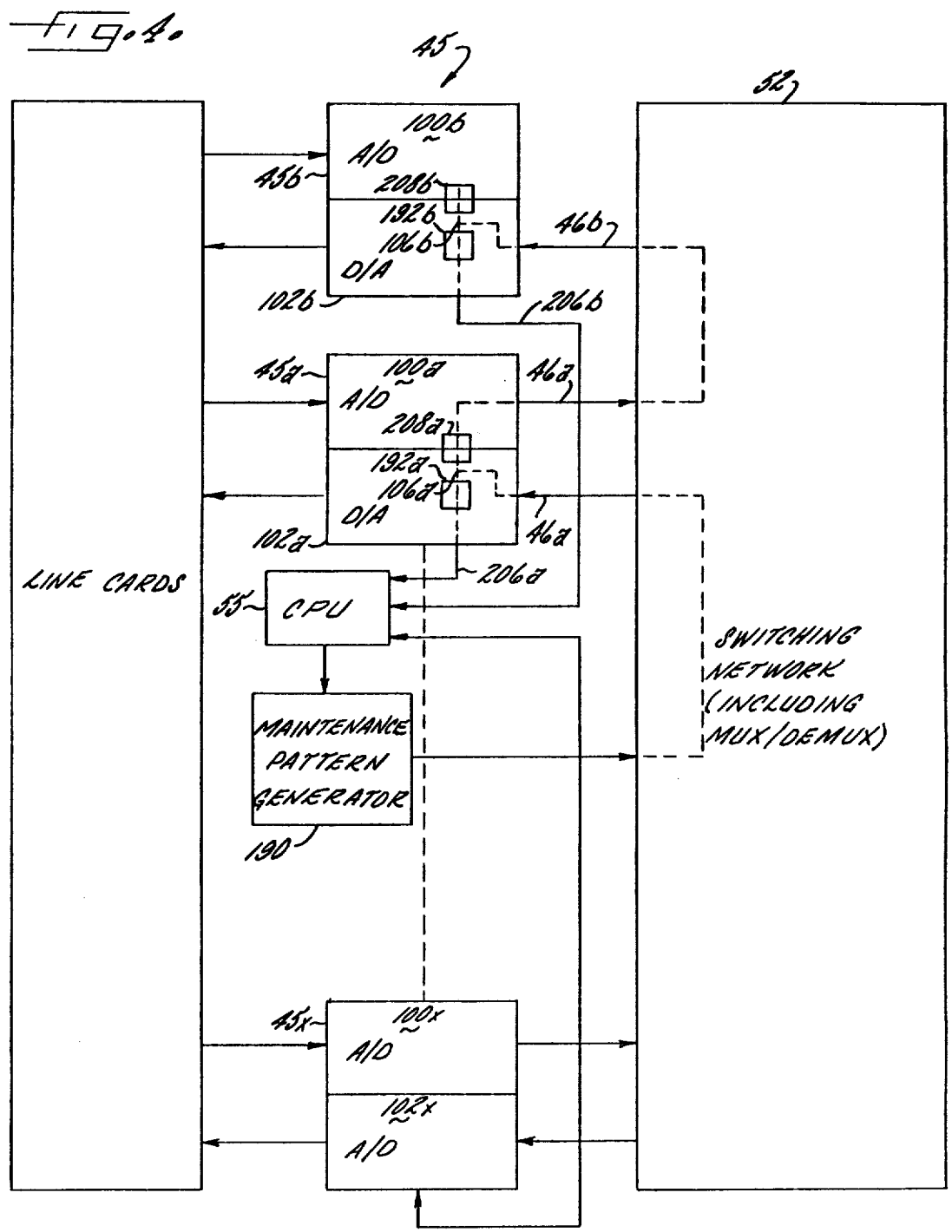

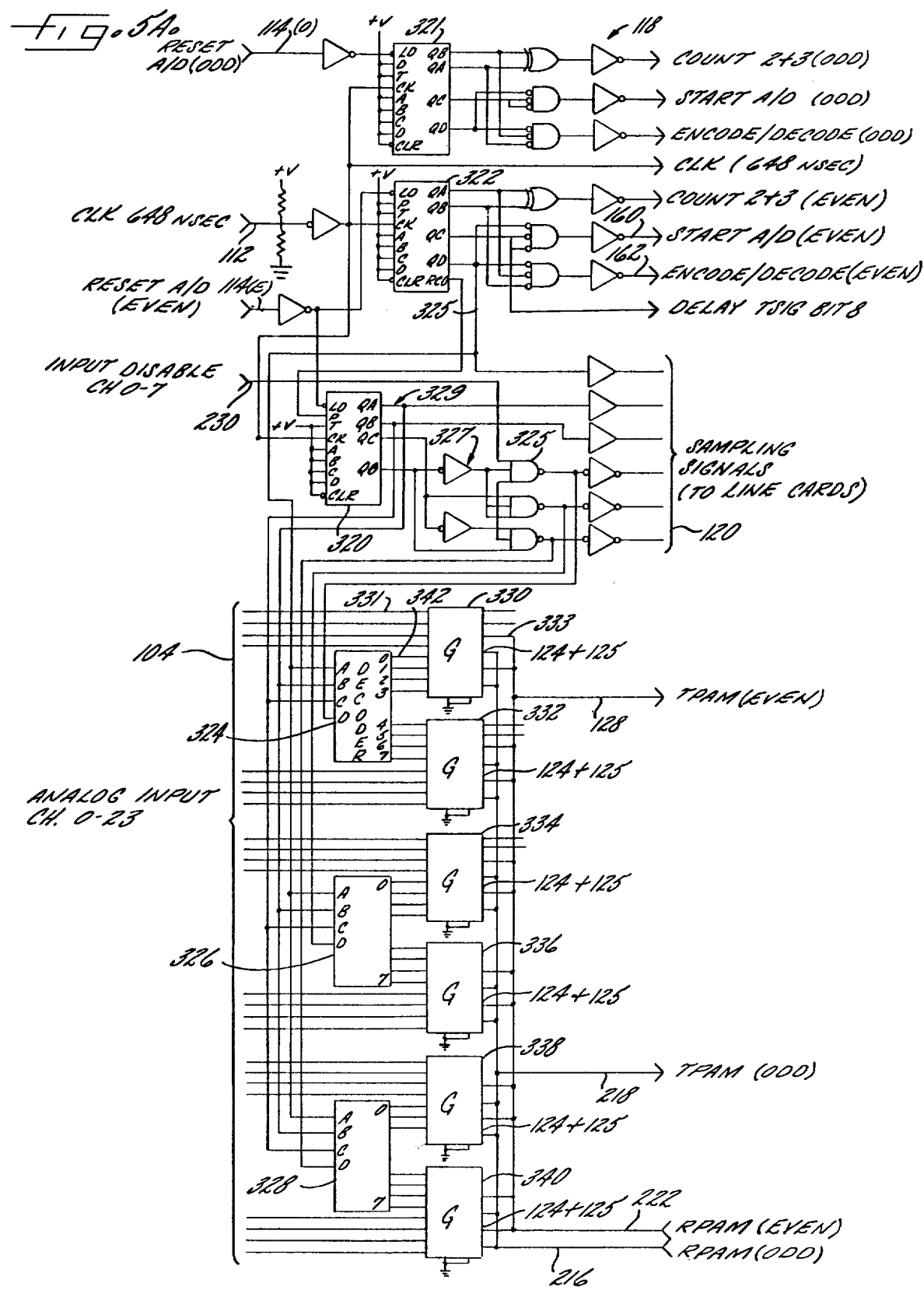

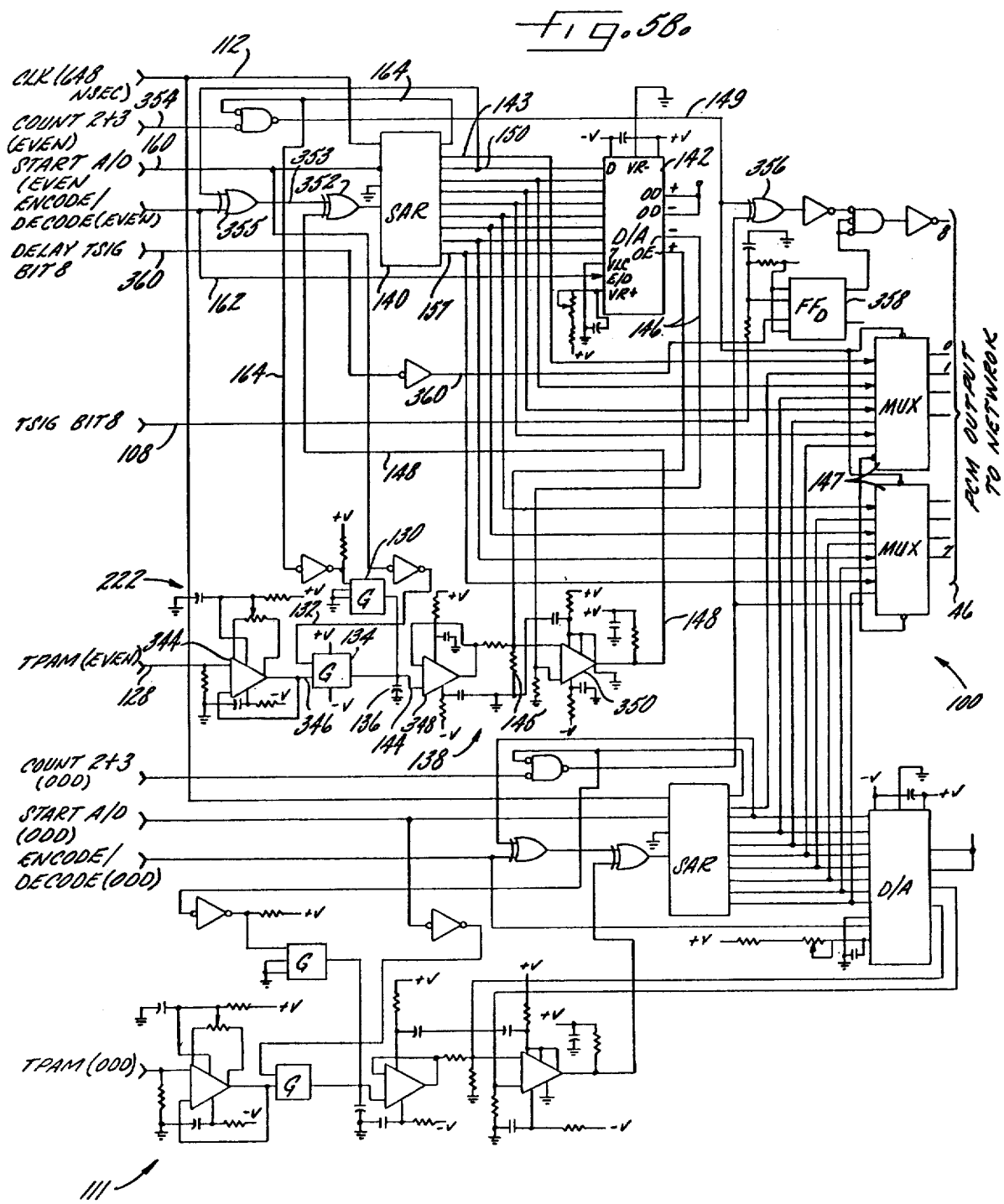

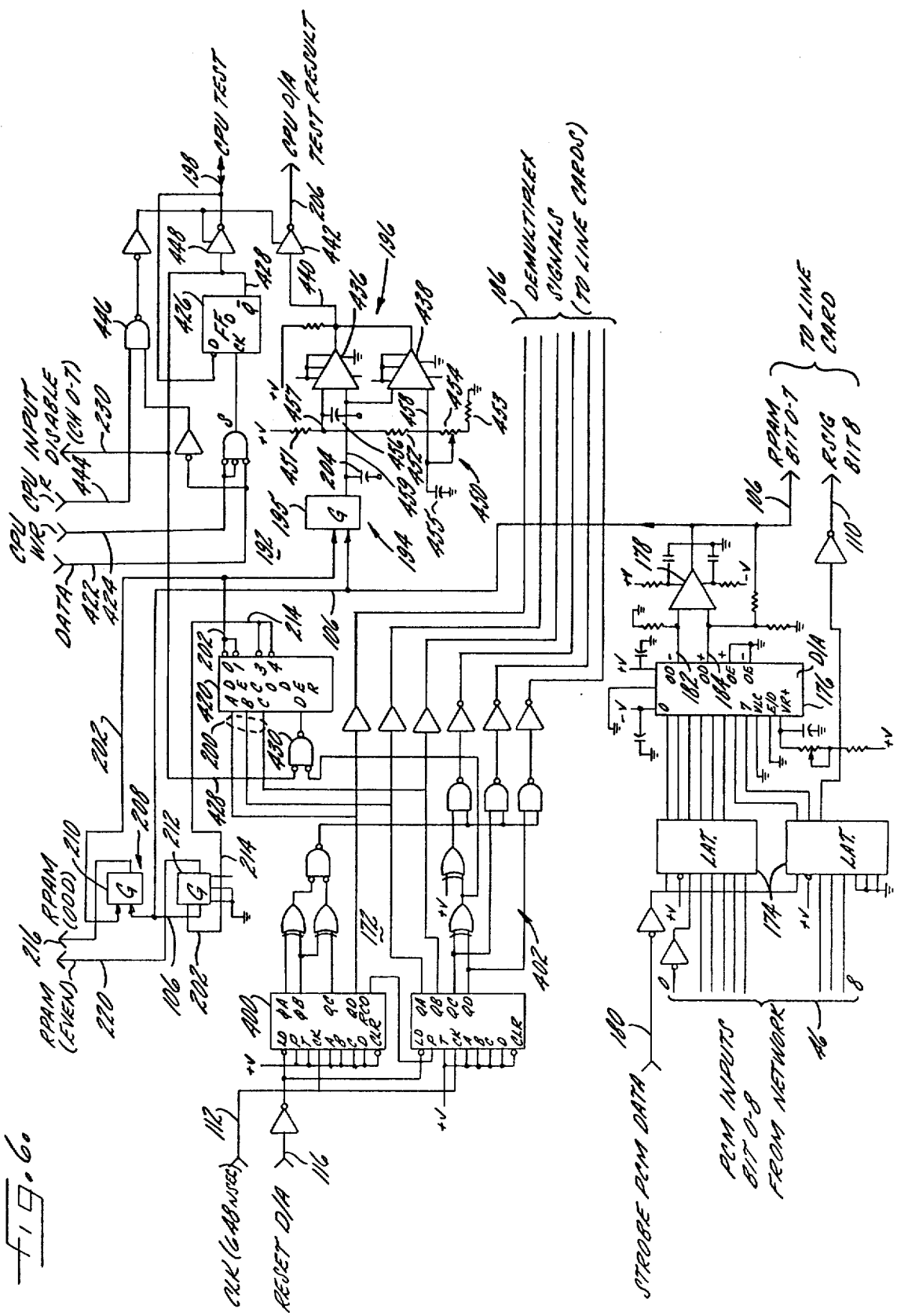

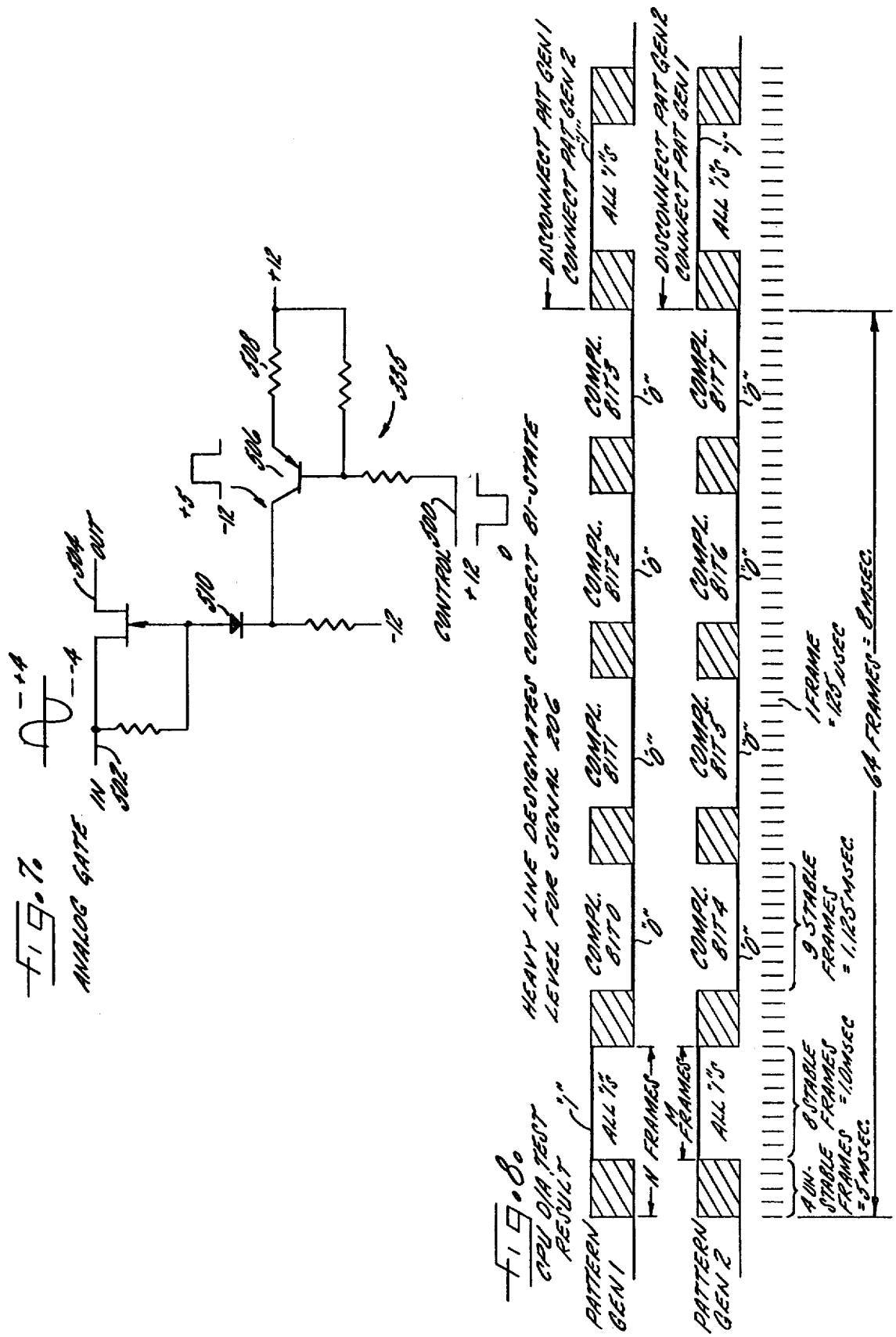

METHOD AND APPARATUS FOR TESTING ANALOG-TO-DIGITAL AND DIGITAL-TO-ANALOG CODE CONVERTERS

BACKGROUND OF THE INVENTION

This invention relates to a digital time division, multiplex telecommunications switching system, and more particularly to an ADA test for providing real time, on line, fault detection and diagnosis of faults in analog-to-digital (A/D) sections and digital-to-analog (D/A) sections of code converters in the switching system.

In general, call processing by a telecommunications switching system is accomplished by connecting a terminal, for transmitting and receiving information, to another terminal by means of a switching network. In a digital time division multiplexed telecommunications switching system the switching network, which includes an information memory, connects one terminal to another terminal "in time" by sequentially storing digital samples of information from first and second terminals in assigned locations of the information memory, swapping the two samples in time and returning the first and second samples respectively to the second and first terminals.

In providing "in time" call processing between analog information terminals, such as telephone instruments, the information transmitted by the terminals must first be sampled (to produce pulse amplitude modulated, PAM, signals) and digitally encoded by analog to digital (A/D) sections of code converters. The resulting successive digital samples (multi-bit binary words which represent data viewable as numbers) from each terminal correspond to a particular channel in the switching system. After sampling and encoding, the digital samples, at A/D section digital outputs, are time multiplexed by multiplexers in order to put several channels of information onto a single transmission path or wire with each channel occupying a dedicated time slot. Whenever a channel is idle, its time slot on the wire will simply be vacant. Time multiplexing of a number of channels serves to minimize the number of physical wires going to the information memories in the switching network. After the swapping has occurred in memory, the information is routed in reverse sequence back through demultiplexers, to digital-to-analog (D/A) sections of code converters and via D/A section analog outputs to the connected terminal.

The swapping of samples in the information memories is accomplished under computer control. The computer or control complex (abbreviated as "CPU") also keeps a record of the status of the switching system including the state of the terminals so as to properly process a request for service. In a system using the present invention, the computer may be distributed microprocessors (as described in Pitroda et al. U.S. application Ser. No. 842,091 filed Oct. 17, 1977 which is a continuation-in-part of Ser. No. 734,732, filed Oct. 21, 1976 and now abandoned) which microprocessors control call processing and monitor the status of the system.

In a digital time division, multiplex switching system of a practical size, having as many as three thousand channels, the number and the complexity of information routing paths or loops to the switching network and "time" paths within the switching network produce a complicated maintenance and diagnostic problem. If, for example, there is a failure in a switching element such as in the connection memory, the wrong channel samples may be swapped. As a second example, malfunction of a voice bit in an A/D or D/A section of a code converter may result in distorted sound transmission of one terminal to another. Any such failure appears to be a fault in the information loop to and from the connection memory including the code converters and the multiplexers/demultiplexers. The maintenance and diagnostic problem becomes how to determine whether there is a real hardware failure in the code converters or the multiplexers/demultiplexers or only an apparent failure in the code converters or the multiplexers/demultiplexers which apparent failure results from "in time" connection failure in the connection memory.

Furthermore, telephone switching equipment must have an extremely high degree of reliability. Commonly, only one hour of system down time in twenty years is the established reliability goal. It is important, therefore, to detect and identify faults as soon as they occur, so that they may be cured expeditiously or back-up equipment placed in service.

Maintenance of the switching system hinges on providing fault detection which is able to rapidly detect real, as opposed to apparent, faulty operation of the system components so that proper remedial action can be taken, i.e. switching in spare circuits or providing fault information so that a craftsperson can replace the faulty components.

SUMMARY OF THE INVENTION

It is an object of the present invention to detect fault conditions in the code converters by means of an ADA test during real time operation of the switching system by apparatus and methods which function more or less continuously and automatically.

It is also an object of the present invention to detect fault conditions in the code converters by means of an ADA test during real time by using a group of idle channels in the switching system so as not to constrain the system's ability to process calls.

It is also an object of the present invention to detect fault conditions in the code converters by means of an ADA test of the switching system and to provide diagnostic information to the system's computer so that the computer can take the appropriate action—switching in spare components or printing out the fault for a craftsperson to utilize.

It is also an object of the present invention to detect fault conditions in the code converters by means of an ADA test and to isolate system faults down to a minimum number of components, such as printed circuit cards.

It is also an object of the present invention to provide ADA fault detection circuitry including a maintenance pattern generator which can be connected via the switching network to the code converters to generate a test pattern and a pattern verification means for detecting faults in the D/A sections of the code converters by comparing the analog data samples on a D/A section analog output resulting from digital to analog conversion of the test pattern to a reference signal.

It is further an object of the present invention to provide a maintenance pattern generator that will sequentially generate a digital test pattern comprising a first digital test pattern corresponding to the maximum value for a digital data sample (all "1"s pattern) and a second digital test pattern consisting of a group of digital data samples resulting from sequentially complementing each bit in the digital data sample one at a time. The generator generates the first test pattern for a predetermined number of frames and then generates the second test pattern for a predetermined number of frames.

It is another object of the present invention to provide a comparator as part of the pattern verification means to determine that the D/A section analog output resulting from accurately converting the first test pattern approximates the reference signal and that the D/A section analog output shifts outside of a given range of values established for the reference signal for the second test pattern if no fault exists.

It is also an object of the present invention to provide a comparator gate which upon command from the system's computer will connect the D/A section analog output to the comparator only during the time in which the test pattern is available in order to detect faults in the D/A section's operation and inform the computer of any such faults.

It is also an object of the present invention to provide ADA fault detection circuitry which further includes a D/A to A/D interconnect gate on a first code converter for connecting the first code converter's D/A section analog output to the A/D section analog input when the test pattern is present, and a second D/A section of a second code converter which is connected via the switching network to the A/D section digital output of the first code converter so that the A/D section of the first code converter can be monitored for faults by monitoring the D/A section analog output of the second code converter.

Other objects and advantages of the present invention will become apparent upon reading the following detailed description and with reference to the drawings, in which:

FIG. 1 is an overall block diagram of a digital time division, multiplex switching system in which a preferred form of the invention is embodied;

FIG. 2 is a simplified block diagram of a code converter which includes circuitry that is illustrative of the present invention;

FIG. 3 is a timing diagram which helps in the description of the operation of the code converter in the block diagram of FIG. 2;

FIG. 4 is a block diagram showing how two or more code converters are interconnected by the switching network so that an A/D section can be tested for a fault;

FIGS. 5A and 5B are schematic diagrams of the A/D section of the code converter;

FIG. 6 is a schematic diagram of the D/A section of the code converter;

FIG. 7 is an electrical schematic of an analog switch used in the code converter of FIG. 2; and FIG. 8 is a timing diagram showing the results of an ADA test cycle which are transmitted to the CPU.

While the invention will be described in connection with certain embodiments presently considered to be preferred, there is no intent to limit it to those embodiments. On the contrary, the intent is to cover all alternatives, modifications and equivalents included within the spirit and scope of the invention as defined by the appended claims.

Referring now to FIG. 1, there is shown an overall block diagram of a telecommunications switching system intended to serve as an illustrative environment for the ADA test of the present invention. The switching system is adapted for connection to a plurality of lines represented by telephone instruments 30, 31, and also to a plurality of trunks generally indicated at 32. The general term access ports will be used herein to denote these and other system input terminals. Circuitry is provided to interface the lines and trunks to the switching system, such circuitry being represented by line circuits 33, 34, analog trunk circuits 35 and digital trunk circuits 36. Because the switching system is of the four wire variety, the line circuits 33, 34 and the analog trunk circuits 35 include hybrids for converting the two wire line signals to four wire for use by the switching system. The digital trunk circuits 36 are not necessary in the practice of the invention, but are shown for sake of completeness. Such circuits are intended to directly interface a T1 digital line to the switching system without the need for code conversion of any sort.

In addition to establishing and maintaining "standard call" connections between lines and trunks, the system is capable of providing additional features where desired. The apparatus for effecting such features being represented by element 38. For example, the system may be configured to carry out, as optional functions, paging, code call, multiport conferences and the like. Additional apparatus as required, for example audio equipment for use with the paging feature, is indicated generally at 39.

Means are provided for receiving and storing dialed digits for use by the control complex in establishing connections between the lines and trunks as required. Such equipment, generally indicated at 40, may include both dial pulse receivers and DTMF receivers, the general term dial receivers being used to encompass both. In addition, the equipment includes registers for storing the digits as they are received.

In order to inform a user of the response of the system to his request, progress tones are required, such tones in the instant embodiment being produced by digital tone generators 41. The tones produced by such generators include dial tone, ring back, busy tone and the like. While analog tone generators may be utilized, the digital tone generators 41 of the instant embodiment eliminate the need for code conversion, and are therefore directly compatible with the switching system.

As noted above, the switching system is configured as a four wire digital system, and therefore requires conversion between the analog information on the trunks and lines to a digital format. To that end, a plurality of code converters having A/D sections and D/A sections are provided indicated generally at 45. In the preferred embodiment the digital code utilized is compatible with North American Industry standards, utilizing an eight-bit format, a 1.544 megabit transmission rate and compression with $\mu$ equal to 255. The code converter block 45 is comprised of a plurality of T1 PCM code converters, each capable of sampling 24 discrete channel lines and converting analog data samples to digital data samples in the direction toward the network. Each code converter also converts digital data samples to analog data samples in the direction toward the lines and trunks and distributes the analog samples to the proper discrete channel line. A practical embodiment of the illustrated switching system can handle a maximum capacity of 3088 channels, 3072 active channels and 16 lost to framing. Such a system would require approximately 128 code converters, each capable of handling twenty-four channels, thereby providing at the output of the code converters 45 a plurality of PCM buses 46, each carrying bidirectional information for 24 channels. In the 3088 channel system, there are approximately 32 of such buses resulting from tying four code converter outputs to each bus. Each bus is in turn implemented as a pair of oppositely directed unidirectional nine-wire cables for carrying nine parallel bits of time sequenced words, each word having eight data bits and a ninth signalling bit.

In order to properly route the digital data samples from the code converters to the network for efficient switching, and from the network back to the code converters for distribution to the lines, a pair of multiplexers are provided, indicated as first order or low level multiplexer/demultiplexer 48 and second order or high level multiplexer/demultiplexer 49. Each low level multiplex section of multiplexer/demultiplexer 48 receives 96 channels of time sequenced parallel bit information from four 24-channel code converters on 32 buses 46 and multiplexes the parallel bit information into serial bit information for 96 channels. The low level demultiplex section demultiplexes the signals flowing in the opposite direction. The high level multiplex section of multiplexer/demultiplexer 49 receives the serial bit information on the 32 incoming buses 50, converts it to ten-bit parallel form (eight data bits, a signalling bit and a parity bit) and arranges it on four parallel ten-wire buses 51 each carrying information for 772 channels. The high level demultiplex section performs the complementary function in the opposite direction using a second ten-wire bus 51. The four 772 channel buses are connected to the four wire non-blocking digital switching network 52 which serves to switch in time information from selected channels for the purpose of completing connections between those channels.

The configuration of the digital switching network itself is known, being explained, for example, in "A Review of Telecommunications Switching Concepts-Part 1" and Part 2 thereof, published in Telecommunications February 1976 and March, 1976, respectively. Suffice it to say that the network, or each block thereof includes an information memory having individually addressable locations for each channel in the system. Information received and processed through the code converters is multiplexed onto the appropriate buses where each channel occupies a dedicated time slot. This information is sequentially written into dedicated memory locations, with all samples being updated each 125 microseconds. For the purpose of making connections, the network, or each block thereof includes one or preferably two connection memories, each having an addressable location dedicated to each channel in the system. A connection is established by writing "paired numbers" into the connection memory. The address of the first line is written at the location assigned to the second line, and vice-versa to "connect" the first and second lines. Thereafter, during the time slot for the first channel, the information memory is written with the data from that channel, and also data is read out of the information memory at the address established by the connection memory, thereby placing the sample from the second channel into the time slot for the first channel for return to the first channel. Subsequently, during the occurrence of the time slot for the second channel, a similar operation takes place with the result being that samples from the two channels are swapped in time causing the first channel to receive samples from the second channel and vice versa. In short, a communication path is established.

In order to accommodate efficiently the 3072 channels, the network is preferably broken into four blocks. Each block writes information to only one fourth of the total number of channels, that is, 768 channels. However, to provide full availability, information from each channel is written into each of the four blocks.

The interaction between the elements of the system described thus far is under the control of the distributed processor control complex 55. Stated generally, the control complex detects requests for service from lines, trunks and the like, determines available class of service for those elements and completes connections in the network. To that end the distributed processor control complex 55 has circuit connections to the line circuits 33, 34, and specifically to sense points thereof for detecting the on-hook or off-hook condition of the lines and changes between such conditions. Circuit connections are also provided to control points on the line circuits and can be used, for example, to initiate or terminate ringing to selected lines, to set attenuators in the transmission path or the like. The complex 55 also has circuit connections to the trunks, and specifically to the sense points for detecting the conditions thereof and to control points for controlling the trunks. Similar connections are provided to the feature circuits 38. Circuit connections between the control complex and the dial receivers and registers 40 are used to cause those receivers to collect dialed digits and to receive the collected digits for the purpose of completing connections. The complex 55 also has circuit connections to the digital tone generators 41 including a maintenance pattern generator 190, the code converters 45 and the multiplexers/demultiplexers 48 and 49 for exercising appropriate control over those elements. Connections are also provided between the complex 55 and the network 52 for allowing the complex to write addresses into the connection memories for the purpose of establishing connections between the access ports.

The control complex also initiates and monitors the ADA test. In that regard, the complex determines when the first eight channels on a code converter card are idle, and orders an ADA test to start. The complex also sets up the network connection in the information memories so that the maintenance pattern generator is connected to the D/A section of the code converter being tested. Furthermore, the complex keeps track of any error resulting from faults in the D/A section of the code converter.

After the D/A sections have been tested, the D/A section analog output of a first code converter is connected to the A/D section analog input of the same code converter, and the computer connects the A/D section digital output of a first code converter to a D/A section digital input of a second code converter. The computer then monitors the D/A section digital output of the second code converter to determine indirectly the presence of a fault in the A/D section of the first code converter.

Additionally, the system makes provision for attendant consoles 56 which typically include an array of indicators or readouts for informing an attendant of system conditions, combined with an array of pushbuttons for allowing the attendant to cause the system to perform specific functions.

Finally, for the sake of completeness, additional elements are shown connected to the distributed processor complex 55, including a system status and maintenance administration panel 57, generally located in the equipment frame for informing a craftsperson of the operational status of the equipment. A data terminal 58 provides a port for entry of information into the system, such as for changing number assignments, and for readout of information from the system, for example, traffic information or the like. A remote terminal interface 59 allows the control complex 55 to be accessed from a remote location for the purpose of trouble-shooting or updating of the program. Finally, a flexible disc playback unit 60 containing the operating program for the system is actuated initially to load the program and may be automatically actuated to reload the program in the event of a major system failure.

In summary, each line circuit (the illustrative 3088 channel system here to be treated provides up to 2400), each trunk circuit (the system provides up to 576) and each register (the system provides for 64) occupies a dedicated channel on one of the code converters within converter module 45. Those channels are multiplexed through multiplexers/demultiplexers 48 and 49 such that ultimately each line, trunk, register or tone occupies a dedicated time slot on one of the 772 channel network buses. During a simplified call processing routine, the control complex 55 detects a subscriber off-hook condition while scanning the array of line circuit sense points. Upon detection of the off-hook, the processor ultimately establishes network-through-connections by writing corresponding addresses into the connection memories in the network. The PCM encoded samples received from the lines, trunks or the like are exchanged between called and calling subscribers every 125 microseconds. After the network-through-connection is established by the processor, the network information memories accept the PCM encoded samples from subscriber A during subscriber A's dedicated time slot and output subscriber B's previously stored sample. The subscriber A sample is stored until the occurrence of the subscriber B time slot whereupon it is read out while a new sample is stored for subscriber B. This swapping operation continues independently of the control complex 55 until a call termination or other action is sensed whereupon the connection may be cancelled or altered via a further writing of addresses into the network connection memories.

In order to provide a clear understanding of the ADA test, the normal operation of a code converter 45 will be described first. Normal operation means that the code converter 45 is processing calls on one or more of the 24 channel which it serves. Turning to FIG. 2, each code converter 47 includes an analog-to-digital section, A/D section, 100 and a digital-to-analog section, D/A section, 102. FIG. 3 shows timing for the various important events which occur in each code converter and is divided into sections 100A and 102A which correspond to the A/D section 100 and the D/A section 102.

During normal operation, the A/D section 100 receives 24 channels of analog data in continuous audio format on 24 analog lines 104 from the line cards, such as 33 and 34 (FIG. 1). The A/D section 100 sequentially samples each of the analog lines 104 to produce a series of analog data samples in pulse amplitude modulated (PAM) format. The A/D section then sequentially converts each analog data sample to a digital data sample and transmits each digital data sample in pulse code modulated (PCM) format on bus 46 to the low level multiplexer 48 and ultimately to the switching network 52.

The D/A section 102 operating in the reverse direction receives serially 24 channels of nine-bit digital data samples in PCM format from the low level multiplexer on nine-wire bus 46. The D/A section then sequentially converts the digital data samples to analog data samples in PAM format, and transmits the analog data samples (RPAM) in time multiplexed fashion on line 106 to the various line cards where the analog data samples are demultiplexed and distributed to individual telephone instruments, such as 30 and 31.

Each code converter 45 also serves as a conduit for a signalling bit. A signalling bit is simply the on or off hook signal or dial pulses from a telephone instrument. Therefore, the signalling bit is in digital format when it is received from a telephone instrument so there is no need for either A/D or D/A conversion with respect to the signalling bit. Furthermore, in FIG. 2, the signalling bit from each of 24 channels has already been multiplexed on the line cards by bit 8 sampling signals 120. As a result, the signalling bit, bit 8, is received by the A/D section from the line cards on line in time multiplexed fashion. Bit 8 is then delayed so that it will be in synchronization with the converted data and finally transmitted on bus 46 to the switching network. In the reverse direction, the signalling bit is received from the network on bus 46 and connected via line 110 to the line cards.

Operation of both the A/D and D/A sections is predicated on serially processing all 24 channels in approximately 125 microseconds. After subtracting 648 nanoseconds from each frame for framing time, each channel is allotted approximately 5.2 microseconds (125 microseconds divided by 24 channels) for a channel time. The basic timing is provided by a 648 nanosecond clock (1.544 megahertz) on line 112 (signal 112A in FIG. 3).

Because there is a finite time delay of approximately 2 channel times (10.4 microseconds) between the operating sequence of A/D section 100 and the operating sequence of D/A section 102, the D/A section operating sequence must be slightly behind the A/D section operating sequence. (The actual delay is 2.75 channel times, but for the sake of simplicity a 2 channel time will be used for illustrative purposes). The necessary delay is provided by synchronizing A/D section 100 with a reset A/D signal on line 114 (signal 114(E) of FIG. 3), delaying approximately two channel times and synchronizing D/A section 102 with a reset D/A signal on line 116 (signal 116A of FIG. 3). As a result, the channel count for A/D section 100 has reached a count of 2 (FIG. 3, channel count 118A) when the channel count for D/A section 102 is 0 (FIG. 3, channel count 200A).

With reference to FIG. 2, it can be seen that the A/D section 100 is divided into two A/D section segments, segment 111 for odd channel lines 113 and segment 222 for even channel lines 224. Recalling that all 24 channels must be processed in sequence in 125 microseconds it is necessary to provide the two A/D section segments in order to meet that timing requirement. By having two A/D section segments, each segment has two channel times in which to complete its A-to-D conversion. Each segment operates continuously and in overlapping time sequence with the other, and the outputs for each segment are multiplexed so that the even segment output bits are transmitted on bus 46 for channel 0 followed by the odd segment output bits for channel 1 and so on.

The A/D section operation is controlled by A/D timing and control circuit 118 which includes a counter for producing an A/D channel count (FIG. 3, signal 118A) to keep track of the channel being processed. The A/D section timing and control circuit 118 also includes timing counters and decoders for generating the timing signals shown in FIG. 3. The decoders also produce sampling signals on lines 122 and 123 which are connected to input gates 124 and 125 for sequentially sampling the analog data on the 24 channel lines 104.

The A/D section timing and control circuit is synchronized by the reset A/D signal on line 114 (in fact two reset signals 114(E) and 114(O) are provided and shown in FIG. 3 relating to the even and odd segments respectively). The A/D section timing and control circuit, after being synchronized, is driven by the 1.554 mghz clock on line 112 signal 112A in FIG. 3).

Because the operation of the odd and even segments of the A/D section are identical except that the odd segments operating sequence has been delayed by the time delay between reset A/D signal 114(E) and reset A/D signal 114(O), only the operation of the even segment will be described. Channel 0, which corresponds to a particular telephone instruments such as 30 and a single line from a line card, is connected to A/D section 100 of code converter 45 on channel 0 line of even channel lines 224. The sampling signal on line 122 controls input gates 124 which select the channel 0 line and provide an analog data sample, TPAM (even), in pulse amplitude modulated (PAM) format on line 128. The analog data sample, TPAM (even), on line 128 is connected to sample and hold circuit 126.

Subsequently, the A/D timing and control circuit 118 generates a sample and hold signal on line 132 (signal 132 (E) of FIG. 3). The sample and hold signal on line 132 closes sample and hold analog gate 134 so that the analog data sample, TPAM (even), on line 128 is connected to sample and hold capacitor 136. The analog data sample, TPAM (even), on line 128 is connected to the sample and hold capacitor 136 for a predetermined length of time which is determined by the operation of the discharge circuit 130 and the sample and hold analog gate 134. As a result, the voltage value to which the capacitor 136 is charged is proportional to the value of TPAM (even) on line 128. In that manner, the sample and hold capacitor 136 samples and holds the value of TPAM (even).

The analog-to-digital conversion of the value of the TPAM (even) held by the sample and hold capacitor 136 is accomplished by means of comparator 138, successive approximation register 140 and D/A converter 142. Sample and hold capacitor 136 is connected to comparator 138 via line 144. The other input 146 of comparator 138 is the analog output of D/A converter 142. Output 148 of comparator 138 is a bi-level logic signal which simply indicates whether the voltage on line 144 is greater or less than the value of the voltage on line 146. The bi-level logic signal on line 148 is then connected to the data input of successive approximation register 140.

Initially, successive approximation register 138 has all of its digital outputs 150-157 set to "0". Those outputs 150-157 are connected directly to the digital inputs of D/A converter 142. After the successive approximation register receives a start A/D (even) signal on line 160 (which occurs at the same time as the sample and hold signal 132(E) of FIG. 3), a clock pulse on line 112 sequentially sets or clears each data bit corresponding to each digital output line 150-157 starting with bit 0, the sign bit, on output line 150. Whether a bit is set to a "1" or cleared to a "0" depends on the output on line 148 of comparator 138. If line 148 is a "1", the bit being processed will be set to a "1" at the output of the successive approximation register 140.

For bit 0, an encode signal on line 162 of D/A converter 142 is set to "0" which disconnects D/A converter 142 from line 146. As a result, input line 146 of comparator is connected to ground through resistor 145. If the voltage on sample and hold capacitor 136 is positive, the voltage on line 144 is greater than the voltage on line 146, and comparator output 148 is a "1". As a result bit 0, the sign bit on line 150, is set to a "1". If, on the other hand, the voltage on sample and hold capacitor 136 is negative, a "0" results on line 148 of comparator 138, and the sign bit on line 150 is cleared to a "0".

During the next period of the clock to successive approximation register 140, after the sign bit has been processed the D/A converter 142 is activated by an encode signal equal to "1" so that an analog output signal on line 146 is produced in response to the value of the remaining digital input bits 1-7 on lines 151-157. The output of the D/A converter 142 on line 146 is connected to the comparator 138 which determines whether the value of the analog output signal from the D/A converter is greater or less than the value of the voltage on sample and hold capacitor 136. If the value of the analog output signal on line 146 is greater than the voltage on line 144, the output 148 of comparator 138 is a "1" and bit 1 on line 151 of the output of the successive approximation register 140 is likewise set to a "1". Likewise, if the value of the analog output voltage is less than the voltage on line 144, bit 1 is cleared to a "0".

The setting and clearing of each successive bit is accomplished in the same manner as previously described with regard to bit 1 until all 8 bits have been processed. When all 8 bits have been processed, a A/D complete signal on line 164 from the successive approximation register 140 appears (FIG. 3, signal 164 (E)).

The A/D complete signal is connected to discharge circuit 130 and activates gate 166 which in turn grounds line 144 to discharge sample and hold capacitor 136. Furthermore, the A/C complete signal lasts until after the next sample and hold signal on line 132 (132(E) of FIG. 3) has closed analog gate 134 so that sample and hold capacitor 136 cannot begin charging again until after the A/D complete signal ceases. After the A/D complete signal ceases, the sample and hold capacitor 136 immediately begins receiving charge from the next channel in the sequential sampling of even channels—in this case channel 2. The discharge circuit 130 thus operates to initialize sample and hold capacitor 136 and to assure that no erroneous charge is fed to sample and hold capacitor 136 during the transition time from channel 0 to channel 2 at input gates 124.

After the A/D conversion is complete, the digital data sample in the format of an eight bit word is available to multiplexer 147 on lines 150-157. A transmit signal on line 149 (FIG. 3, 149(E)) selects inputs 150-157 of multiplexer 147 and connects them to the multiplexer outputs which are connected to bus 46.

FIGS. 5A and 5B disclose a preferred, detailed embodiment for an A/D section 100 for a code converter 45.

With reference to FIG. 5B, it can be seen that the A/D section 100 is divided into two A/D section segments. A/D segment 111 is for processing odd number channels and segment 222 is for processing even numbered channels. Again as with the description for FIG. 2, the description of the detailed, preferred embodiment disclosed in FIGS. 5A and 5B will concentrate on only the even segment 222.

The A/D section operation is controlled by a main counter 320, an odd segment counter 321 and an even segment counter 322 (FIG. 5A). The counters are each a standard SN74LS163 4-bit counter manufactured by Texas Instruments, Dallas, Tex. The inputs and outputs are designated by the standard, functional designations. The main counter 320 and the even segment counter 322 are synchronized with the rest of the switching system by a reset A/D (even) signal on line 114(E) (FIG. 3) which is inverted and connected to the load input on each of the counters. The odd segment counter is synchronized at one channel time later by a reset A/D (odd) signal on line 114(O) so that its count is offset from the count of the even segment counter by one channel time (5.2 microseconds).

The counters are then clocked by the 648 nanosecond clock signal on line 112.

The count on line 329 of main counter 320 and the most significant bit on line 325 of even segment counter 322 are decoded by decoding gates 327 and by binary to decimal decoders 324 (for channels 0 through 7), 326 (for channels 8 through 15), and 328 (for channels 16 through 23). The decoders 324, 326, and 328 are standard binary to decimal decoders, such as SN74LS145 manufactured by Texas Instruments, Dallas, Tex. Again, the inputs and outputs are denoted by standard notation.

A decimal count at the outputs of binary to decimal decoders 324, 326 and 328 control analog input gates 124 and 125. The analog input gates 124 and 125 consist of 24 discrete analog input gates, (such as gate 335 of FIG. 7) grouped in six analog gate packages 330, 332, 334, 336, 338 and 340.

An illustrative embodiment for analog gate 335 shown in FIG. 7, comprises a three terminal device having a control terminal 500, an analog input terminal 502 and an analog output terminal 504. In operation, a negative going pulse (from +12 v to 0v) at control terminal 500 turns on tranistor 506 thereby connecting +12 volts through resistor 508 to the cathode of diode 510. As a result the diode's cathode has a +5 voltage on it and the diode becomes back biased so that any analog signal varying between +4 volts and 4 volts at the analog input 502 is conducted through FET 512 to output terminal 504.

Referring back to FIG. 5A, the channel 0 analog input line of input lines 104 is connected to one input 331 of one analog input gate of package 330. A control signal from binary to decimal decoder 324 on line 342, causes the analog gate for channel 0 in package 330 to connect the input line 331 (channel 0) of the analog gate to the output 333 of the analog gate which is tied to line 128, TPAM (even).

In fact all of the analog gate outputs for even channel line inputs are tied to line 128 so that, as the channel count from main counter 320 increments, successive analog samples from each even channel line are time multiplexed onto line 128 in pulse amplitude modulated format. In the same manner input channel line 104, channel 1, is connected through a different analog gate in package 330 to output line 218, which is TPAM (odd). Also, all of the analog gate outputs for odd channel line inputs are tied to line 218. It would be obvious to one skilled in the art then that each of the 24 channels is selected in turn by means of the main counter 320, the binary to decimal decoders 324, 326 and 328 and the input gates 124 so that the even channels are alternately, in time multiplexed sequence, connected to line 128, TPAM (even), and the odd channels are connected, in time multiplexed sequence, to line 218, TPAM (odd).

The count of main counter 320 is also decoded by decoding gates 327 to provide sampling signals on output lines 120 which are used on the line cards to time multiplex the signalling bit 8 before it is transmitted to the code converter 45.

Again focusing on the even segment of the A/D section and particularly on channel 0, the analog signal on channel line 0 during channel time 0 (FIG. 3) is connected to line 128 by one analog input gate of package 330 as previously described. The analog signal, TPAM (even), on line 128 is then connected to a buffering amplifier 344 (FIG. 5B). The output of amplifier 344 on line 346 is connected to sample and hold analog gate 134. Analog gate 134 (which is also constructed in conformity with FIG. 7) is controlled by the sample and hold (even) signal on line 132 which results from decoding the count of even segment counter 322 and corresponds to start A/D (even) signal on line 160. The control signal on line 132 to analog gate 134 connects TPAM to sample and hold capacitor 136 for a predetermined length of time as previously described with respect to FIG. 2.

The voltage held on sample and hold capacitor 136 is connected to buffer amplifier 348 and subsequently to comparator 350 which together form camparator 138 described in FIG. 2. The output of comparator 350, line 148, is connected through exclusive OR gate 352 to successive approximation register 140. The exclusive OR gate 352 connects either true or complemented logic levels on line 148 to the successive approximation register 140 depending on the sign bit, bit 0, conversion as will be more fully explained.

The outputs of successive approximation register 140, output lines 150 through 157, are connected as previously described to a conventional T1, $\mu=255$, digital to analog converter 142. The outputs 146 of D/A converter 142 are in turn connected back to the comparator 138 and provide a current sink for the inputs to comparator 350. In that manner the outputs 146 of D/A converter 142 control the output on line 148 which in turn controls the input to successive approximation register 140.

The successive approximation register 140 is a standard integrated circuit such as an AM2503 successive approximation register, manufactured by Advanced Micro Devices, Inc., Sunnyvale, Calif. The D/A converter 142 is likewise a standard integrated circuit such as a DAC-76 D/A converter, manufactured by PMI, Santa Clara, Calif.

In operation, the A/D conversion is accomplished by first setting the sign bit on output line 150 of the successive approximation register 140. For setting the sign bit, the encode/decode (even) signal 162 is a "0" which disables outputs 146 of D/A converter 142. The sign bit on line 150 (output from successive approximation register) is also initially a "0" so that exclusive OR gate 355 produces a "0" on line 353 to exclusive OR gate 352. As a result of the "0" on line 353 the comparator's output on line 148 is connected through exclusive OR gate 352 to the data input of the successive approximation register. If the comparator's output is a "1" (indicating a positive sign for TPAM), output 150 is set a "1". If the comparator's output is a "0" (indicating a negative sign for TPAM), output 150 is set at a "0". Line 143 is the complement of line 150.

For negative signals of TPAM, where the sign bit on line 150, has been set to "0" and where the encode/decode (even) signal 162 is a "1" for conversion of bits 1-7, exclusive OR gate 355 produces a "1" output on line 353. The "1" on line 353 causes exclusive OR gate 352 to connect the complement of the comparator's output 148 to the successive approximation register for the subsequent conversion of bits 1-7.

For positive signals of TPAM, where the sign bit has been set to "1", exclusive OR gate 355 produces a "0" output which causes exclusive OR gate 352 to connect the true version of the comparator's output 148 to the successive approximation register for the subsequent conversion of bits 1-7.

In any event, the next bit, bit 1, on line 151, is set by comparing the output on line 146 of D/A converter 142 to the value of TPAM and setting or clearing the bit depending on the result of the comparison.

As a result, the combination of the comparator 138, the successive approximation register 140 and the D/A converter 142 converts TPAM to a digital approximation on lines 150 through 157. The complement of the sign bit on line 143 and the magnitude bits 1-7 on lines 151-157 are in turn connected to multiplexer 147—a standard 2 to 1 multiplexer such as a 8234 multiplexer manufactured by Signetics, Sunnyvale, Calif.

The A/D complete signal at the output of successive approximation register 140 on line 164 in conjunction with count 2 and 3 (even) signal on line 354 from the even segment counter 322 produce a transmit signal on line 149 which selects inputs 143 and 151 through 157 of multiplexer 147 and connects those inputs to the output lines 46. The transmit pulse on line 149 also is connected to exclusive OR gate 356 which causes the signalling bit, bit 8, which is being held in D flip-flop 358, to be transmitted onto bus 46 at the same time as the data bits 0 through 7. Bit 8 as previously stated is a digital representation of the on and off-hook signal and is merely delayed by a delay count from even segment counter 320 on line 360. The count on line 360 simply provides the clock pulse to flip-flop 358 so that the proper signalling bit is available at the output of that flip-flop at the time when the conversion of the particular channel to which bit 8 relates has been completed and a transmit pulse has occurred on line 149.

Also as previously described, when the A/D conversion is complete the A/D complete signal on line 164 is connected to discharge gate 130 (an analog gate construction in conformity with FIG. 7) which is closed so that ground is connected by discharge gate 130 to line 144 in order to discharge capacitor 136 and initialize the circuit for the receipt of TPAM for the next even numbered channel.

Turning to the D/A section 102 of code converter 45, FIG. 2, D/A section 102 comprises a D/A timing and control circuit 172 which produces a D/A channel count on line 200 (FIG. 3, signal 200A), a data latch 174, a standard D/A converter 176 and an amplifier 178.

In operation, digital data samples are received from the network on bus 46. A strobe signal on line 180 strobes data latch 174 to lock in all 9 bits of digital data for a particular channel. The digital data samples on data bus 46 are received in time multiplexed fashion with each channel occupying a given time slot of 5.2 microseconds. The strobe signal on line 180 is timed so that the data on bus 46 is locked in to the latch at the earliest time for which the data bits are stable on the bus.

The output of latch 174 comprises 9 lines corresponding to the 9 bits of input data. Bit 8, which is the signalling bit, is available on line 110 and is connected directly to the trunk cards in the signalling bit is a digital signal and does not require any digital-to-analog conversion.

The other 8 bits held by latch 174 and available at its outputs 175 are connected to the inputs of standard D/A converter 176. The D/A converter is a standard D/A converter having a compression ratio of $\mu$ equals 255 and is similar to the D/A converters used in the odd and even segments of the A/D section.

The D/A converter 176 produces a bipolar analog output on output lines 182 and 184 which are connected to amplifier 178. Amplifier 178 amplifies the difference between the analog signals on lines 182 and lines 184 to produce an output, RPAM, on line 106. RPAM is a pulse amplitude modulated analog data sample having an amplitude which corresponds to the PCM digital data sample at the input of the D/A converter 176. Line 106 carries the analog data samples for all 24 channels in time multiplexed fashion.

In order to separate each time multiplexed channel from the next, demultiplexing signals 186 are generated by D/A channel timing and control circuit 172 by means of a channel counter and decoding circuitry. The demultiplexing signals 186 are connected to the line cards where the actual demultiplexing and distribution of the time multiplexed RPAM signals to individual telephone sets is accomplished. The signalling bit, bit 8, is also demultiplexed on the line cards by means of demultiplexing signals 186.

Because D/A converter 176 can convert the digital data samples to analog data samples within the 5.2 microseconds allotted per channel there is no need to have more than one segment of D/A section 102.

FIG. 6 discloses a detailed preferred embodiment for D/A section 102 for code converter 45. Digital data samples are received from the network on bus 46. A strobe signal on line 180 strobes the data latch 174 to lock in all 9 bits of digital data for a particular channel. The latch 174 is comprised of two hex/quadruple D-type flip-flops such as Texas Instruments' SN74LS174. The output of the latch 174 comprises 9 lines corresponding to the 9 bits of input data. Bit 8, which is the signalling bit is available on line 110 for direct transmission to the trunk cards. The other 8 bits, bits 0 through 7 are connected to a standard digital to analog converter 176, such as PMI's DAC-76 D/A converter. The outputs 182 and 184 of the digital to analog converter 176 are connected to amplifier 178. The output of amplifier 178 on line 106 is RPAM which is transmitted to the line or trunk cards.

Timing for the D/A section 102 is provided by counter 400 (two Texas Instruments' SN74LS163 counters with standard input output designations) which is synchronized with the rest of the switching system by a reset D/A signal on line 116. The counter 400 is then clocked by the 648 nanosecond clock on line 112. The output of counter 400 is decoded by decoding gates 402 to provide demultiplexing signals on line 186 which are connected to the line cards for demultiplexing RPAM on line 106. The demultiplexing signals are also used to demultiplex the signalling bit 8 on line 110.

Having described the operation of the A/D section and the D/A section during normal call processing operation, attention will now be focused on the ADA test which consists of a D/A section test and and A/D section test. Both the A/D section test and the D/A section test are run using a group of idle channels during normal operation of the switching system. The ADA test is initiated when the central processor (CPU) has determined that all of the first eight channel lines, channels 0–7, for particular code converter 45 are idle.

Having determined that the first eight channels of a particular code converter 45 are idle, the CPU can initiate a D/A section test. For a D/A section test, the CPU connects a pair of complementary digital pattern generators 190 (FIG. 1) to the PCM inputs 46 of D/A section 102 (FIG. 2) via switching network 52. The pattern generators 190 generate a digital test pattern with a predetermined recurring sequence which will be more fully described below. Also, the CPU in order to initiate a D/A section test activates pattern verification means connected to the analog output, RPAM, of the D/A section 102.

The complementary pattern generators 190 are connected in the switching network to channels 0, 1, 3 and 4 of the first eight idle channels for particular code converter 45. The test pattern which is produced by the two complementary pattern generators (denoted pattern generator 1 and pattern generator 2) in those test channels, 0, 1, 3 and 4, has the following sequence:

1. pattern generator 1 is connected in the switching network to D/A section channels 0, 1, 3 and 4 and transmits a test pattern for which bits 0–7 are all "1"s;

2. step 1 is repeated for 12 frames (1.5 milliseconds);

3. pattern generator 1 is connected to D/A section channels 0, 1, 3 and 4 and transmits a test pattern in which bit 0 is a "0", and all other bits are "1"s.

4. step 3 is repeated for 13 frames (1.625 milliseconds);

5. steps 3 and 4 are repeated for PCM bits 1, 2 and 3 in sequence;

6. pattern generator 2 is connected in the switching network to D/A section channels 0, 1, 3 and 4 and transmits a test pattern for which bits 0–7 are all "1"s;

7. step 6 is repeated for 12 frames;

8. pattern generator 2 is connected to D/A section channels 0, 1, 3 and 4 and transmits a test pattern in which bit 4 is a "0", and all other bits are "1"s;

9. step 8 is repeated for 13 frames;

10. steps 8 and 9 are repeated for bits 5, 6 and 7 in sequence;

11. the entire sequence is repeated again.

The pattern verification means connected to the RPAM output of D/A section 102 operates on the principle that whenever all 8 PCM bits 0–7 are "1"s, there is a predetermined range of values for RPAM for test channels 0, 1, 3 and 4, and RPAM will be within the range if no fault exists (FIG. 3, signal 106A). Furthermore, if any one of the PCM data bits is complemented, RPAM will fall outside of that range if no fault exists (FIG. 3, signal 106B).

In order to carry out the D/A section test, the pattern verification means includes a maintenance logic circuit 192 (FIG. 2) which on command from the CPU initiates the D/A section test by selecting only test channels 0 and 1. The D/A section test utilizes only channels 0 and 1; channels 3 and 4 are utilized in the A/D section test which will be described below. The maintenance logic circuit 192 also communicates the results of the D/A section test to the CPU.

The pattern verification means further includes a gate and hold circuit 194 which samples and holds the RPAM value for the test channels 0 and 1 resulting from the test pattern on those channels. Also a comparator 196 is provided to compare the value of RPAM resulting from the test pattern to a predetermined reference signal which establishes the range of values for RPAM. The reference signal is determined by a reference biasing network connected to input 460 (inputs 457 and 458 in FIG. 6).

In operation, a CPU test signal on line 198 initiates the D/A section test. The D/A timing and control circuit 172, which includes a channel counter, provides a channel count on line 200 to maintenance logic circuit 192 which in turn decodes channels 0 and 1 and produces a gate and hold signal on line 202 for each of those channel times. The gate and hold signal on line 202 operates gate and hold circuit 194 which comprises analog gate 195 and holding capacitor 204. The gate and hold signal for channels 0 and 1 on line 202 gates an RPAM sample resulting from the test pattern into capacitor 204 during the channel times for D/A section channels 0 and 1 in each frame. RPAM held by capacitor 204 is connected to comparator 196 via input 459. After 4 frames of test pattern, the value RPAM held by capacitor 204 is considered stable, and during the next 8 frames of all "1's" test pattern, for example, the comparator 196 provides a D/A test result signal on line 206 which indicates whether RPAM for the all "1's" test pattern falls within the predetermined reference range or not.

For each subsequent test pattern in the sequence set out above, the CPU can determine whether the values for RPAM of test channels 0 and 1 of the D/A section are within or outside the predetermined range. For an all "1's" test pattern, RPAM must be within the predetermined range or the CPU having received the D/A test result on line 206 records an error in the D/A section 102 of code converter 45. On the other hand, for a test pattern other than all "1's" the value RPAM must fall outside of the predetermined range or the CPU will determine that there is a fault in the D/A section 102 of code converter 45.

A summary of the D/A test results on line 206 is provided by FIG. 8. FIG. 8 shows the correct or "good test" value of the D/A test result signal on line 206 for the test pattern sequence previously described. For pattern generator 1, the CPU D/A test result signal shows that for an all "1's" pattern the first four frames are considered unstable followed by eight stable frames of a "1" output to the CPU. For the subsequent four frames when bit 0 has been complemented in the test pattern, the first four frames again are unstable followed by 9 frames of stable output on line 206. In the case where bit 0 has been complemented, the D/A test result signal at 206 becomes a "0" indicating that the value for RPAM has fallen outside of the predetermined range for the all "1's" test pattern.

The sequence of complementing bits with the intermediate unstable frames proceeds until 64 frames of test pattern have been generated, and the results of the D/A conversion of the test pattern have been transmitted on line 206 to the CPU.

The CPU is programmed to monitor D/A test result signals on line 206 by first searching for seven or more consecutive high signals resulting from an all "1's" pattern in seven consecutive frames. After the seven consecutive highs have been found, the CPU samples the next 64 frames searching for one and only one set of seven consecutive highs. If that pattern is found by the CPU, the CPU determines that the D/A section connected to the test pattern is functioning properly. Stated, conversely, an "error signal" or test failure is generated by making signal 206 (FIG. 8) a 0 when the test pattern is all 1's or a 1 when the test pattern contains at least one 0 among its eight bits $b_0$–$b_7$.

Turning to FIG. 6, a more detailed preferred embodiment of the pattern verification means is shown. A maintenance decoder 420 (a Texas Instruments' SN74LS145 binary to decimal decoder) decodes channel counts 0 and 1 and produces a gate and hold signal on line 202 for the duration of those channels. The maintenance decoder 420 also decodes channel counts 3 and 4 and produces a gate signal on line 214 for the duration of those two channels. This decoder is normally disabled by a "1" level signal at control line 429 (to hold its outputs 202, 214 low) by a flip-flop 426 residing in the reset state until the automatic test mode is initiated by setting the flip-flop so that a 0 level signal appears on line 428.

The D/A section test is initiated by the CPU which puts a "1" on input bus 198 indicating that a maintenance routine is requested. The CPU also causes the maintenance logic to read that maintenance request by putting a "0" on data select input 422 and a "0" on CPU write input 424. As a result, the "1" on input bus 198 is clocked into D-type flip-flop 426 by the data select input on line 422 and the CPU write input on line 424.

The $\bar{Q}$ output 428 of D-type flip-flop 426 is thus low during the test mode; it is connected to gate 430 which thus applies a "0" to enabling line 429 so long as counter 400 is signaling a channel count state of between 0 and 7. The gate 430 disables the decoder 420 when counter 400 holds counts above 7 so that the decoder does not decode any channels above channel 7 as test channels. The $\bar{Q}$ output 428 of D-type flip-flop 426 is also connected to input disable 230 which is routed to gate 327 of the A/D section 100 (FIG. 5A) of code converter 45 in order to disable the channel lines 0 through 7 to the input gate packages 330 and 332 when the automatic test is in progress.

When the test pattern data samples for channels 0 and 1 are received on inputs 46, the samples in each channel 0 and 1 are sequentially decoded by D/A converter 176 and comparator 178 to produce in sequence an RPAM signal for each channel on line 106. The RPAM signal on line 106 is connected to gate and hold circuit 194 which includes analog gate 195 (constructed in conformity with FIG. 7) and holding capacitor 204. The gate and hold signal on line 202 controls analog gate 195 to connect the RPAM signal on line 106 to capacitor 204 during channel times 0 and 1 so that the capacitor 204 holds a charge proportional to the value of RPAM resulting from the test pattern.

The value of the charge on capacitor 204 is connected to comparator 196 which includes amplifiers 436 and 438. The reference signal, which determines the range of values for RPAM resulting from the test pattern, is established by reference biasing network 450 (including resistor 451, 452 and 453, potentiometer 454 and capacitors 455 and 456) connected to the inputs 457 and 458 of amplifiers 436 and 438. The output of the comparator 196 on line 440 is connected to a gated output driver 442 and in turn to D/A test result line 206.

In order for the CPU to read the results of a D/A section test on line 206 the CPU puts a "0" on data select input 422 and a "1" on CPU read line 444. Together those two signals activate gate 446 which in turn activates drivers 442 and 448 so that the CPU can determine by a "1" on line 198 that a maintenance D/A section test is in progress and by the result on line 206 what the outcome of that test was.

Because the driver 448 is a tri-state gate, the CPU may apply a 0 level voltage for a short time to line 198 in order to reset the flip-flop 426 after the full sequence of an automatic test has been carried. That is, after the sub-portion of the test with bit 7 complemented (see FIG. 8) is finished, the CPU may pull the line 198 down to a 0 level while simultaneously placing 0 level signals on line 422 and write line 424. This will "clock" flip-flop 426 to the reset state, making line 428 change to a 1 level, to disable the decoder 420 and terminate the test mode of operation.

In addition to testing the D/A section of each code converter, there is also provision made for testing the A/D section of each code converter. The A/D section test is predicated on having two previously tested, good D/A sections available in two separate code converters. The A/D section to be tested is interconnected between the two good D/A sections so that a test pattern connected to a first D/A section is connected through the A/D section to be tested to a second D/A section. If the RPAM output of the second D/A section does or does not fall within a certain discrepancy range in relation to the expected response to the test pattern, then the A/D section is revealed as good or bad because both D/A sections had been previously tested.

More specifically with reference to FIG. 4, the A/D section test is accomplished by connecting the test pattern generator 190 via switching network 52 to channels 0, 1, 3 and 4 of a first previously tested D/A section 102a of a first code converter 45a. The RPAM output 106a resulting from the test pattern of the tested D/A section 102a of the first code converter 45a is connected by means of an D/A to A/D interconnect gate 208a to the A/D section 100a to be tested of the same first code converter 45a. The A/D section 100a produces digital data samples on A/D section digital outputs 46a which digital data samples relate to the test pattern. The D/A section digital outputs on bus 46a are connected via the switching network 52 to a second previously tested D/A section 102b on a second code converter 45b, and the RPAM output 106b generated by the second code converter's D/A section is monitored by the CPU on line 206b.

The CPU 55 in monitoring the second code converter's RPAM output determines whether the RPAM output for the second code converter's D/A section is within the predetermined range when an all "1's" test pattern is generated by the test pattern generator and whether the RPAM value falls outside of the predetermined range of values when one of the bits in the test pattern has been complemented. In this way, the performance of the interconnected A/D section 100a can be monitored. As an extension of the exemplary embodiment, of course, A/D section 100b could be likewise tested by setting up the proper interconnection in the switching network so that the pattern generator signals flow from D/A section 102b via a gate 208b to A/D section 100b and thence through a network connection to some third D/A section,—thereby testing two A/D sections in series. Likewise, an A/D section 100x could be tested as long as 2 D/A sections on two different code converters are available for connection to the A/D section 100x to be tested. Of course, if two (or more) D/A sections and one (or more) A/D sections are placed "in series" in accordance with the teaching of this invention, it is not vital that the D/A sections have been first individually tested and found free of malfunctions; in this case, the detection of an error would indicate that at least one of the sections is faulty, and the location of the defect could then be narrowed down.

Testing the A/D section by monitoring RPAM for the D/A section 102b of the second code converter allows for normal A/D errors which result from the approximations used in the A to D conversion. The A to D conversion does not have to be exact for the A/D section test to be correct. The advantage of the present A/D section test lies in the fact that it only requires and assures that if a bit is complemented in the test pattern, at least one bit (not necessarily the same bit) in the A/D section 100a being tested will change, and that change will cause RPAM on the second code converter 102b to fall outside of the predetermined range. Such a test assures that the A/D section 100a is reacting to changes in the RPAM without having to determine the exact level of change.

In order to implement the A/D section test, gate means for interconnecting the D/A section RPAM output to the A/D section inputs are provided for the D/A section test channels 0, 1, 3 and 4. With reference to FIGS. 2 and 6, D/A to A/D interconnect gate 208 is provided which has two switches 210 and 212 which are operated respectively by (i) the gate and hold signal on line 202, which corresponds to channel times 0 and 1 of the D/A section (FIG. 3, D/A section channel count), and by (ii) a gate signal on line 214, which corresponds to channel times 3 and 4 of the D/A section (FIG. 3, D/A section channel count).

In operation, interconnect gate switch 210 closes during D/A section channel times 0 and 1 (FIG. 3) and connects RPAM by means of line 216 to the odd A/D section segment at line 218, TPAM (odd), to test odd A/D section segment 111. Reference to FIG. 3 indicates that when channels 0 and 1 of D/A section 102 are connected to the odd A/D section segment 111, the odd A/D section segment is processing channel 3 as indicated by sample and hold odd signal 132(O).

Likewise interconnect gate switch 212 closes during D/A section channel times 3 and 4 (FIG. 3) and connects RPAM by means of line 220 to the even A/D section segment at line 128, TPAM (even), to test even A/D segment 222. Reference again to FIG. 3 shows that when D/A section channels 3 and 4 are connected to the even A/D section segment 222, that segment is processing A/D channel 6 as indicated by sample and hold even signal 132(E).

As previously described, RPAM for D/A section channels 0, 1, 3 and 4 results from the receipt and conversion of the test pattern by the D/A section 102. Therefore, the A/D section 100, when it receives RPAM during A/D section channel times 3 and 6, converts the RPAM for the test pattern to produce a digital representation of the test pattern from RPAM.

It should also be noted that during the time that the D/A section 102 and the A/D section 100 are interconnected (the first 8 channel times), an input disable signal on line 230 serves to disable the inputs to the A/D section 100 so that any noise in the analog input lines will not be sampled and will therefore not interfere with the A/D section test.

Interconnecting the RPAM output of D/A section 102 to the analog input of A/D section 100 for the A/D section channel times 3 and 6 causes the A/D section 100 to produce a digital data sample at the A/D section digital output during channel times 3 and 6 which corresponds to the test pattern which was initially generated by the maintenance pattern generator 190 (FIG. 1).

In order to complete the A/D section test, the digital data samples of A/D section 100a (FIG. 4) must be connected to a second D/A section 102b of a different code converter card 45b. Keeping in mind that two channel times, for example, are required to transmit the digital data samples through the switching network and back to the D/A section 102b of code converter 45b, channels 3 and 6 of A/D section 100a, of course, could not be received within the same frame on channels 0 and 1 and 3 and 4 of D/A section 102b. Therefore, the switching network is controlled to hold the information from channels 3 and 6 of A/D section 100a until the next frame, when it connects channel 3 of A/D section 100a to channels 0 and 1 of D/A section 102b, and connects channel 6 of A/D section 100a to channels 3 and 4 of D/A section 102b. The CPU when monitoring the output 206b simply ignores the transition frame in interpreting the results of the A/D section test.

The ADA test as previously discussed comprises a D/A section test and an A/D section test. Also as previously discussed the D/A section test can be run separately (when the CPU causes a single set network connection from pattern generators to the input of a single D/A section during its idle channels 0–7) so as to determine whether or not a particular D/A section of a particular code converter is operating properly by comparing RPAM for a particular test pattern to a predetermined range of values. Also as previously discusses, the A/D section test is predicated on having at least two tested and good D/A sections available, one of which must be a D/A section for the same code converter of which the A/D section that is to be tested is a part. For the A/D section test, the CPU creates a similar set of network connections (as those for the D/A test), and in addition, creates a second set of network connections from the output of the A/D section to the input of a second D/A section, and then monitors the test results as signaled at line 206 of that second section.

We claim:

1. In a digital time division, multiplex telecommunications switching system having code converters, each code converter having an A/D section and a D/A section, where the A/D section sequentially time samples analog data presented on A/D section analog inputs from discrete channel lines to provide analog data samples, converts the analog data samples to digital data samples on A/D section digital outputs and transmits the digital data samples in dedicated time division channels, grouped in frames, to a switching network for making time connections under control of a computer and where the D/A section receives digital data samples in dedicated time division channels, grouped in frames, from the switching network on D/A section digital inputs, converts the digital data samples to analog data samples and distributes the analog data samples, via a D/A section analog output, to discrete channel lines, a code converter fault detector comprising:

(a) pattern generator means for generating a test pattern of digital data samples for conducting a test on a code converter which is connected via the switching network to predetermined channels received by the D/A section of the code converter; and (b) pattern verification means for verifying that the D/A section has accurately converted the test pattern's digital data samples to analog data samples, including comparator means connected to the D/A section analog output for comparing all the analog data samples resulting from the test pattern to a single fixed predetermined value of a reference signal for each test and generating an error signal in response to a discrepancy between the analog data samples and the value of the reference signal so that the D/A section of the code converter can be monitored for fault conditions.

2. The fault detector of claim 1, wherein the pattern generator means provides a first test pattern of digital data samples which, when accurately converted to analog data samples, produces analog data samples approximating the value of the reference signal and a second test pattern of digital data samples which, when accurately converted to analog data samples, produces analog data samples that are less than the value of the reference signal.

3. The fault detector of claim 2 wherein the first test pattern is all "1"s for a predetermined number of frames and the second test pattern consists of sequentially complementing each bit in the first test pattern.

4. The fault detector of claim 1 wherein the pattern verification means further includes channel count decoder means and comparator gate means, the comparator gate means being interposed between the D/A section analog outputs and the comparator means and operably controlled by the channel count decoder means so that the only predetermined channels received by the D/A section are selected for verifying that the D/A section accurately converted the test pattern's digital data samples to analog data samples.

5. The fault detector of claim 4 wherein the verification means further comprises a test result transmit means for connecting the error signal to the computer to indicate the presence of the error signal.

6. In a digital time division, multiplex telecommunications switching system having code converters, each code converter having an A/D section and an associated D/A section, where the A/D section sequentially time samples analog data presented on A/D section analog inputs from discrete channel lines to provide analog data samples, converts the analog data samples to digital data samples on A/D section digital outputs and transmits the digital data samples in dedicated time division channels, grouped in frames, to a switching network for making time connections under control of a computer and where the D/A section receives digital data samples in dedicated time division channels, grouped in frames, from the switching network on D/A section digital inputs, converts the digital data samples to analog data samples and distributes the analog data samples, via a D/A section analog output, to discrete channel lines, a code converter fault detector comprising:

(a) pattern generator means for generating a test pattern of digital data samples for conducting a test on a code converter connected via the switching network to D/A section digital inputs of a previously tested D/A section of a first code converter for predetermined channels received by the previously tested D/A section of the first code converter;

(b) D/A to A/D gate means for interconnecting the D/A section analog output to the A/D section analog input of the first code converter, the A/D section of the first code converter operable to provide digital data samples, corresponding to the test pattern, at the A/D section digital outputs of the first code converter; and (c) a second code converter having a previously tested D/A section with D/A section digital inputs connected by means of the switching network to the A/D section digit outputs of the first code converter, the D/A section of the second code converter having pattern verification means including comparator means connected to the D/A section analog output of the second code converter for comparing all the analog data samples at the D/A section output of the second code converter to a single fixed predetermined value of a reference signal for each test and for generating an error signal in response to a discrepancy between the analog data samples of the D/A section of the second code converter and the value of the reference signal, so that the A/D section of the first code converter can be checked for a fault condition by monitoring the error signal from the D/A section of the second code converter.

7. The fault detector of claim 6, wherein the pattern generator means provides in sequential frames a first test pattern of digital data samples which, when accurately converted to analog data samples, produces analog data samples approximating the value of the reference signal and a second test pattern of digital data samples which, when accurately converted to analog data samples, produces analog data samples that are less than the value of the reference signal.

8. The fault detector of claim 7 wherein the pattern generator means provides a test pattern of all "1"s for a predetermined number of frames followed by sequentially complementing each bit in the digital data sample.

9. The fault detector of claim 6, wherein the D/A section of the first code converter further includes a D/A to A/D gate decoder for selecting the predetermined channels received by the D/A section and operably controlling the D/A to A/D gate means in response to the predetermined channels received by the D/A section of the first code converter so that the predetermined channels received by the D/A section are connected to the A/D section.

10. The fault detector of claim 9 wherein the pattern verification of the second code converter further includes channel count decoder means and comparator gate means, the comparator gate means being interposed between the D/A section analog outputs of the second code converter and the comparator means and operably controlled by the channel count decoder means so that the predetermined channels received by the D/A section of the second code converter are selected for verifying that the D/A section of the second code converter accurately converted the digital data samples from the A/D section of the first converter to analog data samples.

11. The fault detector of claim 10 wherein the verification means of the second code converter further comprises a test result transmit means for connecting the error signal to the computer to indicate the presence of the error signal.

12. In a digital time division, multiplex telecommunications switching system having code converters, each code converter having an A/D section and a D/A section, where the A/D section sequentially time samples analog data presented on A/D section analog inputs from discrete channel lines to provide analog data smaples, converts the analog data samples to digital data samples on A/D section digital outputs and transmits the digital data samples in dedicated time division channels, grouped in frames, to a switching network for making time connections under control of a computer and where the D/A section received digital data samples in dedicated time division channels, grouped in frames, from the switching network on D/A section digital inputs, converts the digital data samples to analog data samples and distributes the analog data samples, via a D/A section analog output, to discrete channel lines, a method of detecting fault conditions in a code converter comprising:

(a) generating a test pattern of digital data samples for conducting a test on a code converter;

(b) connecting the test pattern to the D/A section digital inputs of a code converter by means of the switching network for predetermined channels received by the D/A section of the code converter; and (c) verifying that the D/A section has accurately converted the test pattern's digital data samples to analog data samples by comparing all the analog data samples resulting from the test pattern for the predetermined channels to a single fixed predetermined value of reference signal for each test and generating an error signal in response to a discrepancy between the analog data samples and the value of the reference signal so that fault conditions in the code converter can be detected.

13. The method of detecting fault conditions in a code converter of claim 12 wherein generating the test pattern of digital data samples further includes generating a first test pattern of digital data samples, which when accurately converted to analog data samples, produces analog data samples approximating the value of the reference signal and generating a second test pattern of digital data samples which, when accurately converted to analog data samples, produces analog data samples that are less than the value of the reference signal.

14. The method of detecting fault conditions in a code converter of claim 13 wherein the first test pattern is all "1"s for a predetermined number of frames and the second test pattern consists of sequentially complementing each bit in the first test pattern.

15. The method of detecting fault conditions in a code converter of claim 12 wherein the step of verifying further includes selecting only the analog data samples for the predetermined channels for comparing the analog data samples to the predetermined value of the reference signal.

16. The method of detecting fault conditions in a code converter of claim 15 wherein the step of verifying further includes transmitting the error signal to the computer to indicate the presence of a fault condition.

17. In a digital time division, multiplex telecommunications switching system having code converters, each code converter having an A/D section and an associated D/A section, where the A/D section sequentially time samples analog data presented on A/D section analog input from discrete channel lines to provide analog data samples, converts the analog data samples to digital data samples an A/D section digital outputs and transmits the digital data samples in dedicated time division channels, grouped in frames, to a switching network for making time connections under control of a computer and where the D/A section receives digital data samples in dedicated time division channels, grouped in frames, from the switching network on D/A section digital inputs, converts the digital data samples to analog data samples and distributes the analog data samples, via a D/A section analog output, to discrete channel lines, a method of detecting fault conditions in a code converter comprising:

(a) generating a test pattern of digital data samples for conducting a test on a code converter;

(b) connecting the test pattern to D/A section digital inputs of a previously tested D/A section of a first code converter by means of the switching network for predetermined channels received by the previously tested D/A section of the first code converter;

(c) interconnecting the D/A section analog output to the A/D section analog input of the first code converter for the predetermined channels of the D/A section of the first code converter;

(d) connecting the digital data samples at the A/D section outputs of the first code converter, via the switching network, to the D/A section digital inputs of a second code converter, and comparing all analog data samples from the D/A section of the second code converter resulting from the test pattern to a single fixed predetermined value of reference signal for each test and generating an error signal in response to a discrepancy between the analog data samples from the D/A section of the second code converter to the value of the reference signal so that fault condition in the A/D section of the first code converter can be detected.

18. A method of monitoring a D/A converter in a PCM time multiplex communication system, wherein digital sample data words are applied in successive channels of successive frames to the input of a D/A converter which acts to produce an analog output pulse representing the value of each word in each channel, said method comprising:

(a) switching into a preselected channel at the input of said D/A converter a predetermined test pattern word, (b) comparing all output pulses produced by the D/A converter in that channel to a single reference signal of fixed predetermined value related in known fashion to the correct analog equivalent of the predetermined test pattern word, and (c) producing an output error signal during any of the preselected channel time when the comparison indicates a certain discrepancy in the magnitudes of the compared values.

19. The method set out in claim 18, further characterized by the step of determining that the preselected channel is idle and not carrying data words prior to performing the switching of step (a).

20. The method defined in claim 18, wherein said switching is continued for a predetermined number of N frames, and further including (d) monitoring for the absence of said error signal appearing in the preselected channel time for a succession of M frames, where the M frames are included within the N frames and M is no greater than N, to confirm lack of malfunction in the D/A converter.

21. The method defined in claim 18, further characterized in that said step (c) includes (c') producing an output signal at one or the other of two levels when said certain discrepancy does or does not exist, whereby the error signal is constituted by the output signal having said one level, and including the steps of (d) changing at least one bit in the predetermined test pattern word to perform said step (b) with a modified test pattern word during some frames, and (e) utilizing said output signal as an indication of error if it has said other level during such some frames.

22. The method set out in claim 21 wherein said step (d) includes (d') individually changing different ones of the bits $b_o$–$b_n$ in said predetermined test pattern word during different frames or groups of frames $FR_o$–$FR_n$ constituting said some frames, and said step (e) includes (e') monitoring said output signal to detect a malfunction in said D/A converter indicated by the output signal having said other level during the preselected channel time within any of said frames or groups of frames $FR_o$–$FR_n$.

23. The method set out in claim 22 wherein said comparing step (b) is carried out during the preselected channel time of every frame by a single voltage comparing device.

24. The method of monitoring to detect faults in code conversion components of a PCM time multiplex communication system, such system including A/D converter (ADC) sections receiving as inputs PAM pulse signals in different time channels of successive frames to produce PCM multi-bit data words sent to a switching network in different time channels, and D/A converter (DAC) sections receiving as inputs PCM multi-bit data words sent to it from the network in different time channels for conducting a test on a code converter to produce output PAM pulse signals in corresponding channels, said method comprising (a) injecting into the input of a first DAC section, during a preselected channel, a predetermined test pattern word, (b) coupling the PAM output of said first DAC section, during a channel corresponding to said preselected channel, to the input of one ADC section, (c) coupling the PCM output of said one ADC section to the input of a second DAC section during corresponding channel times, and (d) monitoring the output of the second DAC section during the corresponding channel times to determine whether the analog output values agree with a fixed predetermined reference signal.

25. The method defined in claim 24 wherein said step (c) includes (c') establishing a connection through said network from the output of said one ADC section to the input of said section DAC section.

26. The method defined in claim 24 wherein said step (a) includes (a') establishing a connection through said network from a digital test pattern word generator to the input of said first ADC section.

27. The method defined in claim 24 wherein said step (b) includes (b') enabling a gate interposed between the output of said first DAC section and the input of said one ADC section during a channel time corresponding to said preselected channel.

28. The method defined in claim 27 further including (b'') whenever said gate is disabled, gating off the regular input to said one ADC section to prevent entry of noise or spurious signals.

29. The method defined in claim 24 wherein said step (d) includes (d') comparing the PAM output pulse of the second DAC section during the corresponding channel times with a preestablished reference voltage essentially equal to the correct analog equivalent of the predetermined test pattern word, and (d'') making a monitor signal have a first or second value when the comparison indicates less than or greater than a certain discrepancy in the magnitudes of the compared values.

30. The method set out in claim 29 further including (e) changing at least one bit in the predetermined test pattern word to perform said steps (d') and (d'') with a modified test pattern word during some frames, and (f) detecting said monitor signal taking on said first value as an indication of error.

31. The method set out in claim 30 wherein said step (e) includes (e') individually changing different ones of the bits $b_o$–$b_n$ in said predetermined test pattern word during different frames or groups of frames $FR_o$-$FR_n$ constituting said some frames, and said step (f) includes (f') detecting a malfunction by the appearance of said first value in said monitor signal during the preselected channel time within any of said frames or groups of frames $FR_o$–$FR_n$.

32. The method defined in claim 24 further including (e) before performing steps (a), (b), (c), (d), ascertaining that said first and second DAC sections are not malfunctioning, whereby the execution of steps (a)–(d) results in a determination as to whether said one ADC section is or is not malfunctioning depending upon whether said analog value does or does not agree with said expected counterpart.

33. The method set out in claim 24 further including the preliminary step (a') before switching the predetermined test pattern word into the preselected channel, ascertaining that such channel is idle and not carrying PCM data words.

34. The method defined in claim 24 further characterized in that said steps (a)–(c) are carried out in each of a plurality of N successive frames, and said step (d) is carried out in each of M frames, where M is no greater than N and each of the M frames is one of the N frames.

* * * * *